(12) United States Patent
Miyamoto

(10) Patent No.: US 8,215,891 B2
(45) Date of Patent: Jul. 10, 2012

(54) SUBSTRATE TREATING APPARATUS, AND A SUBSTRATE TRANSPORTING METHOD THEREFOR

(75) Inventor: Yukiteru Miyamoto, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 798 days.

(21) Appl. No.: 12/339,980

(22) Filed: Dec. 19, 2008

(65) Prior Publication Data

US 2009/0162172 A1    Jun. 25, 2009

(30) Foreign Application Priority Data

Dec. 20, 2007 (JP) ................................. 2007-328928

(51) Int. Cl.
*B65H 1/00*       (2006.01)
*H01L 21/306*     (2006.01)
(52) U.S. Cl. .................. 414/411; 414/805; 414/935
(58) Field of Classification Search .................. 414/411, 414/805, 806, 217, 935
See application file for complete search history.

(56) References Cited

U.S. PATENT DOCUMENTS

| | | | | |
|---|---|---|---|---|
| 4,770,590 | A * | 9/1988 | Hugues et al. ................. | 414/172 |
| 5,783,834 | A * | 7/1998 | Shatas ....................... | 250/559.33 |
| 6,188,323 | B1 * | 2/2001 | Rosenquist et al. ........ | 340/686.5 |
| 6,388,436 | B1 * | 5/2002 | Nodot et al. ............. | 324/750.02 |
| 6,401,554 | B1 * | 6/2002 | Mori et al. ................... | 73/865.9 |
| 6,419,439 | B2 * | 7/2002 | Schlehahn et al. ........ | 414/331.18 |
| 6,591,160 | B2 * | 7/2003 | Hine et al. .................... | 700/218 |
| 7,115,891 | B2 | 10/2006 | Komatsu | |
| 7,618,226 | B2 * | 11/2009 | Takizawa et al. ......... | 414/416.08 |
| 2003/0119214 | A1 | 6/2003 | Kitazawa et al. | |
| 2003/0154002 | A1 * | 8/2003 | Lappen et al. ................ | 700/218 |

FOREIGN PATENT DOCUMENTS

| | | |
|---|---|---|
| JP | 6-246658 | 9/1994 |
| JP | 9-232404 | 9/1997 |
| JP | 11-354604 | 12/1999 |
| JP | 2002-164411 | 6/2002 |
| JP | 2002-184839 | 6/2002 |
| JP | 2002-527897 | 8/2002 |
| JP | 2006-185960 | 7/2006 |
| KR | 10-2004-0042894 | 5/2004 |
| KR | 10-2007-0069990 | 7/2007 |
| WO | 00/22589 | 4/2000 |

OTHER PUBLICATIONS

Notice of Allowance date Nov. 30, 2010 in connection with corresponding Korean Patent Application No. 10-2008-0129191.
Japanese Office Action dated May 31, 2011 in connection with corresponding Japanese Application No. 2007-328928.

* cited by examiner

*Primary Examiner* — Charles A Fox
(74) *Attorney, Agent, or Firm* — Ostrolenk Faber LLP

(57) ABSTRACT

A substrate treating apparatus includes a treating section, a table for receiving a FOUP (Front Opening Unified Pod) storing the substrates, and an attaching and detaching unit for a lid to/from an access opening of the FOUP placed on the table. A transport unit is movable to a transfer position opposed to the access opening of the FOUP, and has support members for supporting the substrates, the transport unit transporting the substrates held by the support members between the treating section and the FOUP. A substrate detecting unit detects the substrates stored in the FOUP with the lid detached, a support member detecting unit detects the support members of the transport unit, and a control unit determines whether to transport the substrates, with the lid detached and the transport unit moved to the transfer position, based on detection of the substrates, and detection of the support members.

12 Claims, 6 Drawing Sheets

SUBSTRATE TREATING APPARATUS, AND A SUBSTRATE TRANSPORTING METHOD THEREFOR

BACKGROUND OF THE INVENTION (1) Field of the Invention

This invention relates a substrate treating apparatus and a substrate transporting method therefor, that transport a plurality of substrates such as semiconductor wafers (hereinafter called simply substrates) with a transport device between a FOUP (Front Opening Unified Pod) capable of storing the substrates as sealed off from ambient atmosphere, and a treating section for cleaning and drying or otherwise treating the substrates.

(2) Description of the Related Art

Conventionally, this type of apparatus has an attaching and detaching mechanism for attaching and detaching a lid to/from an access opening of the FOUP (Front Opening Unified Pod), and mapping arms vertically movable, with the lid opened, in a stacking direction of the substrates to detect the number and positions of the substrates stored in the FOUP (see Patent National Publication No. 2002-527897, for example).

This substrate treating apparatus further includes a transport mechanism having a plurality of support arms and movable adjacent the access opening to transport a plurality of substrates from inside the FOUP (see Japanese Unexamined Patent Publication H11-354604, for example). After the lid of the FOUP is opened, the storage positions and number of substrates are determined by the mapping arms, and the transport mechanism in a transfer position extends the plurality of support arms into the FOUP to receive and take out a plurality of substrates all together.

The conventional apparatus with such a construction has the following drawback.

Although, in the conventional apparatus, the storage positions and number of substrates in the FOUP are determined by the mapping arms, the support arms of the trans-port mechanism having moved to the transfer position adjacent the access opening of the FOUP are not necessarily in positions fit for receiving the substrates.

In other words, since the FOUP has only a small space therein for storing the substrates, even if the transport mechanism is in the transport position, there is no knowing whether the support arms can transfer the substrates without interfering with the substrates. If the transport mechanism takes out the substrates in this state, the substrates can be damaged. It may seem that, where the transport mechanism is designed to have the support arms at a height not interfering with the substrates, the support arms will not interfere with the substrates as long as the transport mechanism has moved to the transfer position. In actual situations, however, there is a possibility of damaging the substrates due to bending of the support arms, a lowering in positioning accuracy at times of movement, or other causes.

SUMMARY OF THE INVENTION

This invention has been made having regard to the state of the art noted above, and its object is to provide a substrate treating apparatus and a substrate transporting method therefor, which can reliably prevent damage to substrates by checking whether support members of a transport device are in positions fit for a transporting operation, thereby avoiding interference between the support members and the substrates.

The above object is fulfilled, according to this invention, by a substrate treating apparatus that transports a plurality of substrates with a transport device, comprising a treating section for treating the substrates; a table for receiving a FOUP (Front Opening Unified Pod) for storing the plurality of substrates; an attaching and detaching device disposed between the treating section and the table for attaching and detaching a lid to/from an access opening of the FOUP placed on the table; the transport device being movable to a transfer position opposed to the access opening of the FOUP across the attaching and detaching device, and having a plurality of support members for supporting the plurality of substrates, the transport device being arranged to transport the substrates as held by the support members between the treating section and the FOUP; a substrate detecting device for detecting the plurality of substrates stored in the FOUP with the lid detached by the attaching and detaching device; a support member detecting device for detecting the support members of the transport device; and a control device for determining whether to transport the substrates, in a state of the lid detached by the attaching and detaching device and the transport device moved to the transfer position, based on a result of detection of the substrates by the substrate detecting device, and a result of detection of the support members by the support member detecting device.

According to this invention, the control device determines whether to transport the substrates, in the state of the lid detached by the attaching and detaching device and the transport device moved to the transfer position, based on a result of detection of the substrates by the substrate detecting device, and a result of detection of the support members by the support member detecting device. This feature can prevent damage to the substrates caused by interference between the substrates and support members.

In this apparatus, the substrate detecting device may be arranged to detect the substrates while moving in a direction of alignment of the substrates stored in the FOUP; the support member detecting device may be arranged to detect the support members while moving in a direction of alignment of the support members; and the control device may be arranged to cause the transport device to unload the substrates out of the FOUP when the support members are determined to be in transfer positions relative to the substrates in the FOUP.

The control device causes the transport device to unload the substrates out of the FOUP when, based on the results of detection by the substrate detecting device and support member detecting device, the support members are determined to be in transfer positions relative to the substrates in the FOUP. Thus, damage to the substrates caused by interference between the substrates and support members is reliably prevented when the substrates are unloaded from inside the FOUP.

In this apparatus, the support member detecting device may be arranged to detect the support members while moving in the direction of alignment of the support members supporting the substrates; and the control device may be arranged to cause the transport device to load the substrates into the FOUP when the support members are determined to be in transfer positions relative to substrate storage positions in the FOUP.

The control device causes the transport device to load the substrates into the FOUP when the support members are determined to be in transfer positions relative to substrate storage positions in the FOUP. Thus, damage to the substrates caused by interference between the substrates and support members is reliably prevented when the substrates are loaded into the FOUP.

In another aspect of the invention, a substrate trans-porting method is provided for transporting substrates to and from a FOUP (Front Opening Unified Pod) for storing a plurality of substrates, the FOUP being placed in a substrate treating apparatus that treats the substrates in a treating section, the method comprising a step of detaching a lid from an access opening of the FOUP, and moving a transport device having a plurality of support members to a transfer position; a step of carrying out a detecting operation by moving, in a direction of alignment of the substrates, a substrate detecting device for detecting the plurality of substrates stored in the FOUP, and a support member detecting device for detecting the support members of the transport device; a step of checking, based on the detecting operation, a relative position between the support members of the transport device and the substrates in the FOUP; a step of notifying an abnormality when the relative position is in a relationship of interference between the substrates and the support members; and a step of carrying out a transporting process when the relative position is in a relationship of non-interference between the substrates and the support members.

According to this invention, the lid is detached from the access opening of the FOUP, the transport device having a plurality of support members is moved to a transfer position, a detecting operation is carried out by moving the substrate detecting device support member detecting device in the direction of alignment of the substrates, and a relative position between the support members of the transport device and the substrates in the FOUP is checked based on the detecting operation. An abnormality is notified when the relative position is in a relationship of interference between the substrates and the support members. On the other hand, a transporting process is carried out when the relative position is in a relationship of non-interference between the substrates and the support members. The transporting process is carried out only when the relative position between the substrates and support members is free from interference. It is thus possible to avoid interference between the substrates and support members to prevent damage to the substrates when transporting the substrates.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

A preferred embodiment of this invention will be described in detail hereinafter with reference to the drawings.

Figure 1:
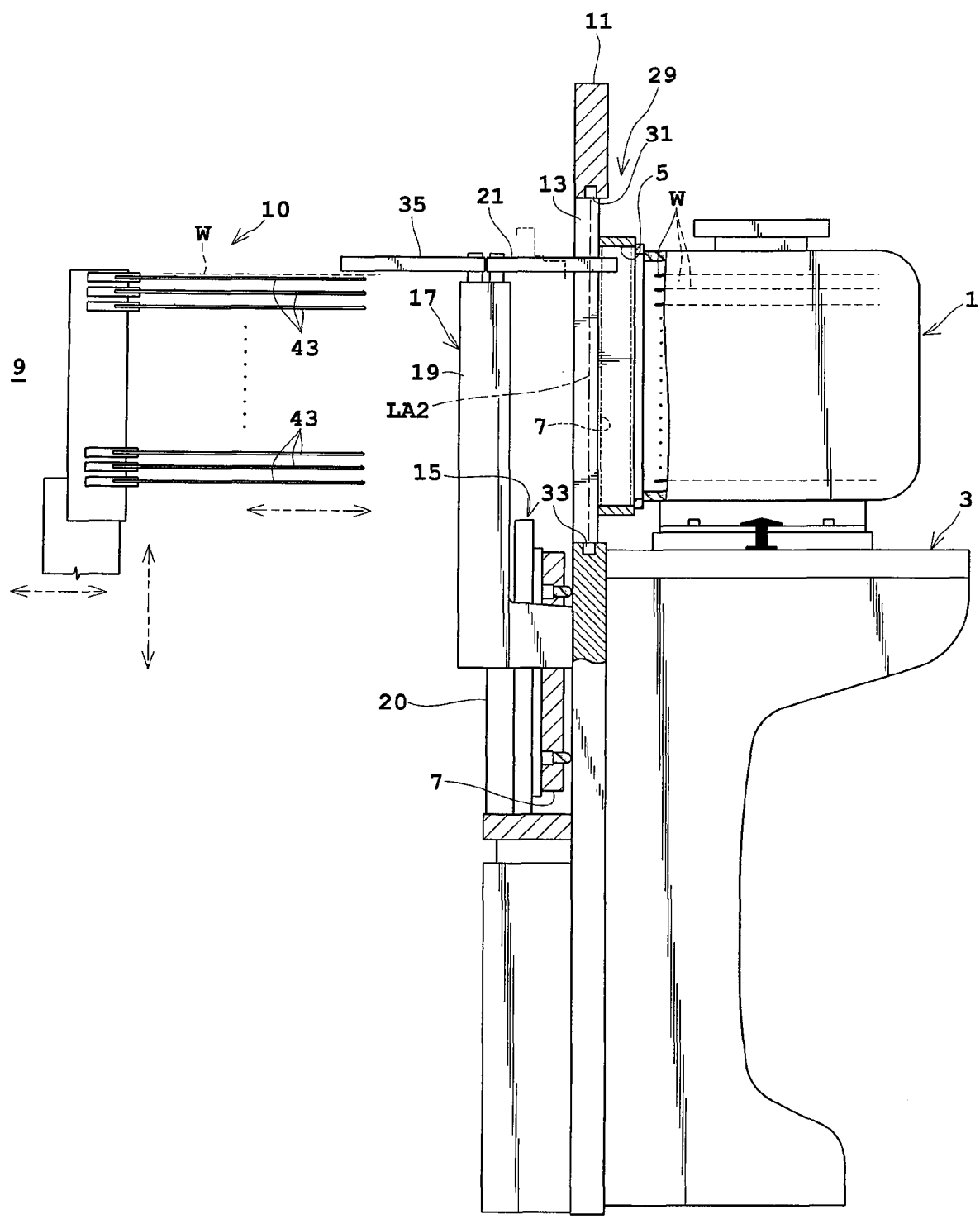
FIG. 1 is a fragmentary view in vertical section showing an outline of a substrate treating apparatus according to this invention.
Figure 2:
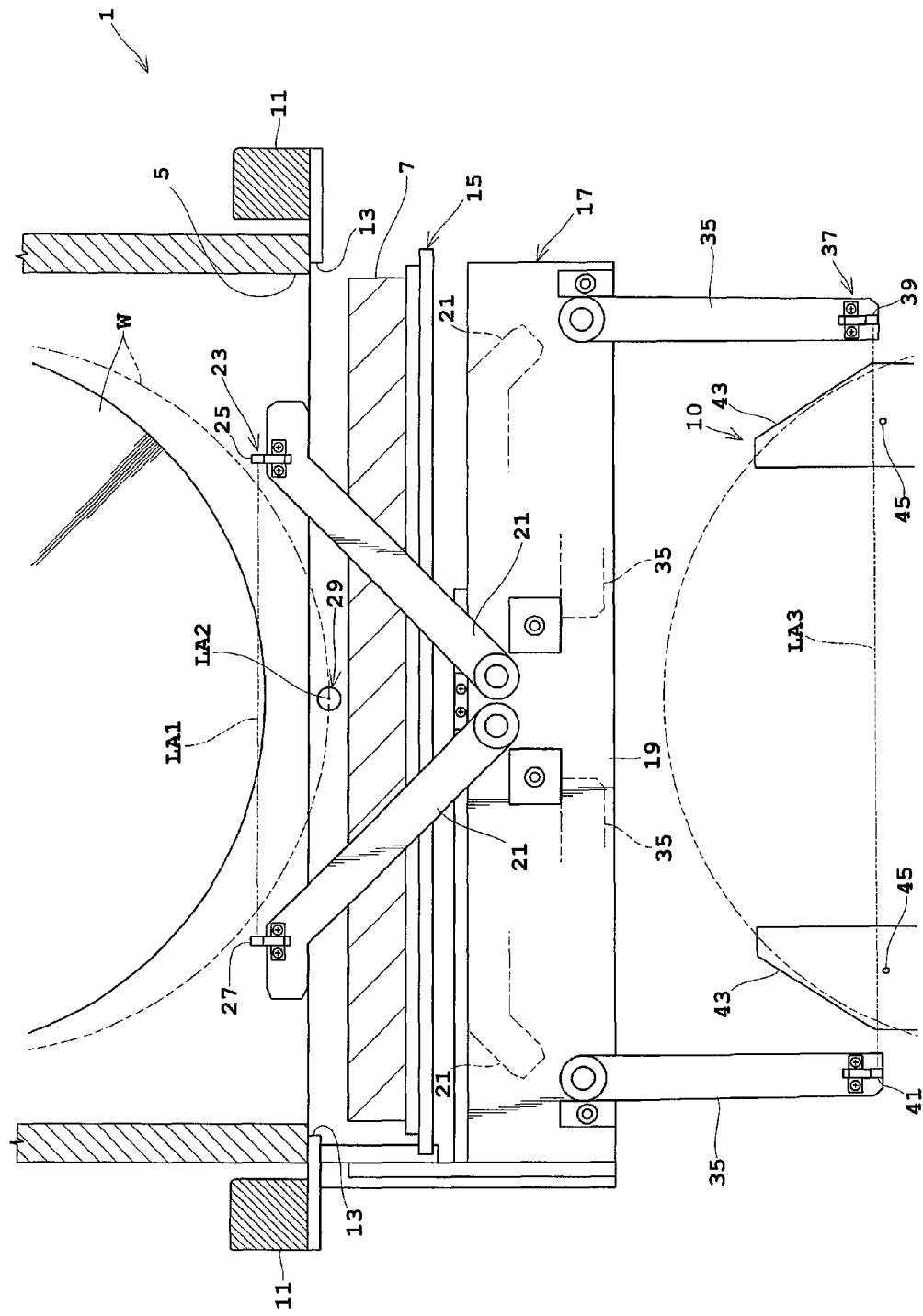
FIG. 2 is a fragmentary plan view showing a principal portion of the substrate treating apparatus.

FIG. 1 is a fragmentary view in vertical section showing an outline of a substrate treating apparatus according to this invention. FIG. 2 is a fragmentary plan view showing a principal portion of the substrate treating apparatus.

The substrate treating apparatus in this embodiment includes a table 3 for receiving a FOUP 1 storing a plurality of wafers W stacked vertically therein. The FOUP 1 has an access opening 5 formed in one side thereof through which the wafers W are loaded and unloaded. A lid 7 is attached to the access opening 5 to seal off the interior of FOUP 1 from ambient atmosphere.

The substrate treating apparatus has a treating section 9 for carrying out various treatments of the wafers W, such as forming a predetermined pattern on the wafers W, carrying out chemical treatment of wafers W, and so on. The treating section 9 is opposed to the table 3 across a transport mechanism 10 movable to a transfer position. The table 3 has a shielding member 11 extending vertically adjacent the transport mechanism 10. The shielding member 11 has an opening 13 formed in one location thereof. This opening 13 is opened and closed only when the FOUP 1 is present on the table 3, and remains closed at other times.

The opening 13 is opened and closed by a lid attaching and detaching unit 15 which corresponds to the "attaching and detaching device" in this invention. Specifically, the lid attaching and detaching unit 15 is vertically movable between a "close position" (shown in a two-dot chain line in FIG. 1) for closing the opening 13, and an "open position" below the opening 13 and close to the transport mechanism 10 where the lid 7 of FOUP 1 detached is also located.

The above transport mechanism 10 corresponds to the "transport device" in this invention.

A detecting unit 17 is disposed between the transport mechanisms 10 and a side of the lid attaching and detaching unit 15 opposed to the treating section 9. The detecting unit 17 is operable separately from the lid attaching and detaching unit 15, and has a lift member 19 connected to the side of the lid attaching and detaching unit 15 opposed to the transport mechanism 10. The lift member 19 is inverted L-shaped as seen from the opening 13 of the shielding member 11, in order not to interfere with extension and retraction of support members described hereinafter, and is driven up and down by a lift actuator 20 (cantilever mode). The lift actuator 20 has a stepping motor or electric motor and a position detecting device not shown, and outputs position information at a time of vertical movement to a controller described hereinafter.

The lift member 19 has a pair of mapping arms 21 mounted on an upper surface thereof and extending toward the FOUP 1. The mapping arms 21 have proximal ends thereof swingable about vertical axes on the upper surface of the lift member 19, and a mapping sensor 23 attached to distal end regions. The mapping arms 21 are opened apart (in a state containment on the lift member 19) at a time of standby as shown in two-dot chain lines. When detecting the wafers W as described hereinafter, the mapping arms 21 change into a half-closed state as shown in FIG. 2 to be able to detect edges of the wafers W. The mapping sensor 23 has a light transmitter 25 and a light receiver 27. The light transmitter 25 and light receiver 27 are attached to the respective mapping arms 21 to be opposed to each other so that an optical axis LA1 may be in a position for detecting the wafers W normally stored in the FOUP 1 (in normal positions). When detecting the wafers W, the mapping arms 21 are moved along with the lift member 19 in a direction of alignment of the wafers W (in the vertical direction in FIG. 1, and in the direction of plane of FIG. 2) by the lift actuator 20.

The above pair of mapping arms 21 and mapping sensor 23 correspond to the "substrate detecting device" in this invention.

A protrusion detector 29 is provided in the opening 13 of the shielding member 11. The protrusion detector 29 has a light transmitter 31 and a light receiver 33, for example. The light transmitter 31 is embedded in an upper part of the opening 13 while the light receiver 33 is embedded in a lower part. The protrusion detector 29 has an optical axis LA2 located in a position for detecting wafers W protruding to a large extent from the access opening 5 of FOUP 1 (displaced position shown in a two-dot chain line in FIG. 2). This displaced position is about 23 mm from the normal position.

The detecting unit 17 has a pair of detecting arms 35 mounted on the upper surface and extending toward the transport mechanism 10. The detecting arms 35 have proximal ends thereof attached adjacent opposite ends of the lift member 19 which are positions not interfering with the mapping arms 21. These proximal ends are swingable about vertical axes on the upper surface of the lift member 19. The detecting arms 35 are closed (in a state containment on the lift member 19) at a time of standby as shown in two-dot chain lines (FIG. 2). At a time of detecting operation, the detecting arms 35 are opened to have distal ends thereof projecting as shown in FIG. 2. A support member sensor 37 is attached to the distal ends. The support member sensor 37 has a light transmitter 39 and a light receiver 41. The light transmitter 39 and light receiver 41 are attached to the respective detecting arms 35 to be opposed to each other so that an optical axis LA3 may be in a position for detecting the transport mechanism 10 having advanced to a transfer position to transfer wafers W to and from the FOUP 1. More particularly, this is a position for detecting edges of support members 43 for supporting a plurality of wafers W, when the transport mechanism 10 has moved to the transfer position and is in a state of standby before the support members 43 are advanced to the FOUP 1. The support members 43 are arranged in a plurality of stages at intervals corresponding to storage racks for wafers W provided in the FOUP 1. Each support member 43 is U-shaped in plan view, and has projections 45 formed in positions of the vertexes of an equilateral triangle in plan view for supporting the back surface of a wafer W by point contact (only two projections being shown in FIG. 2 for reasons of illustration).

The above pair of detecting arms 35 and support member sensor 37 correspond to the "support member detecting device" in this invention.

Figure 3:
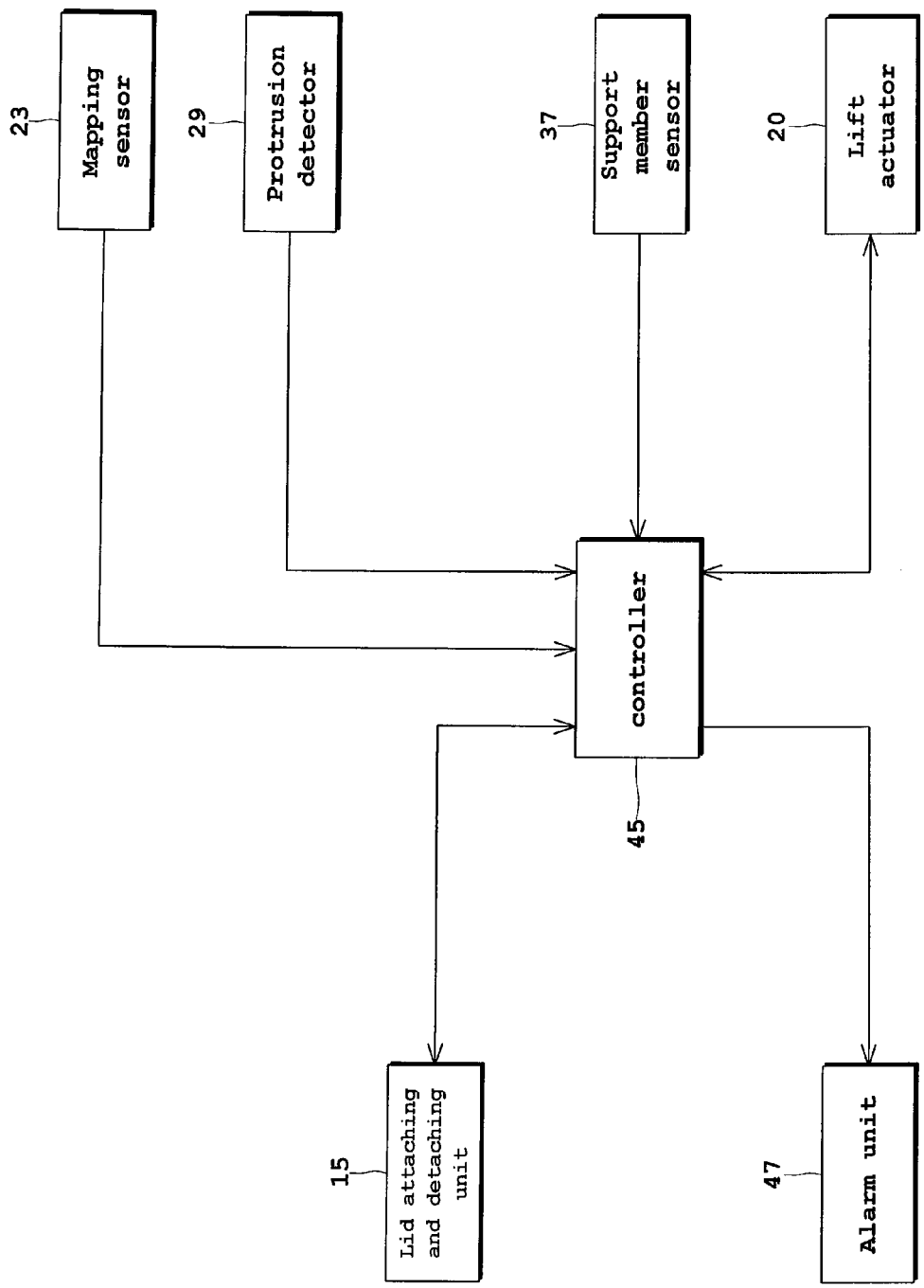
FIG. 3 is a block diagram showing a control system.

Reference is made now to FIG. 3. FIG. 3 is a block diagram showing a control system.

A controller 45 having a CPU, timer, counter and so on carries out an overall control of vertical movement and operations for attaching and detaching the lid 7 of the lid attaching and detaching unit 15, drive control of the lift actuator 20, opening and closing of the mapping arms 21, opening and closing of the detecting arms 35, vertical movement of the detecting unit 17, and processing of output signals of the mapping sensor 23 and support member sensor 37. In the event of an abnormal condition, the controller 45 operates an alarm unit 47 to report the abnormal condition. The alarm unit 47 may consist of a lamp and/or buzzer, for example. Based on detection signals from the mapping sensor 23 and position information from the lift actuator 20, the controller 45 stores positions in the FOUP 1 where the wafers W are stored. The controller 45 determines that an abnormal condition has occurred when the support members 43 are not located in positions corresponding to the wafers W stored in the FOUP 1, that is, when the wafers W and support members 43 are in a positional relationship of interference, based on position information from the support member sensor 37 and lift actuator 20. The controller 45 determines that the situation is normal when the support members 43 are located in positions corresponding to the wafers W stored in the FOUP 1, that is, when the wafers W and support members 43 are in a positional relationship of non-interference.

The positional relationship of interference herein includes cases where, for example, the support members 43 are located at the same heights as the wafers W, at the same heights as the storage racks holding the wafers W, at heights of different wafers W or at heights of storage racks holding different wafers W. The positional relationship of non-interference means that, when unloading wafers W, the support members 43 are located at heights slightly below the storage racks holding corresponding wafers W, and when loading wafers W, the support members 43 are located at heights slightly above the receiving storage racks.

The above controller 45 corresponds to the "control device" in this invention.

Figure 4:
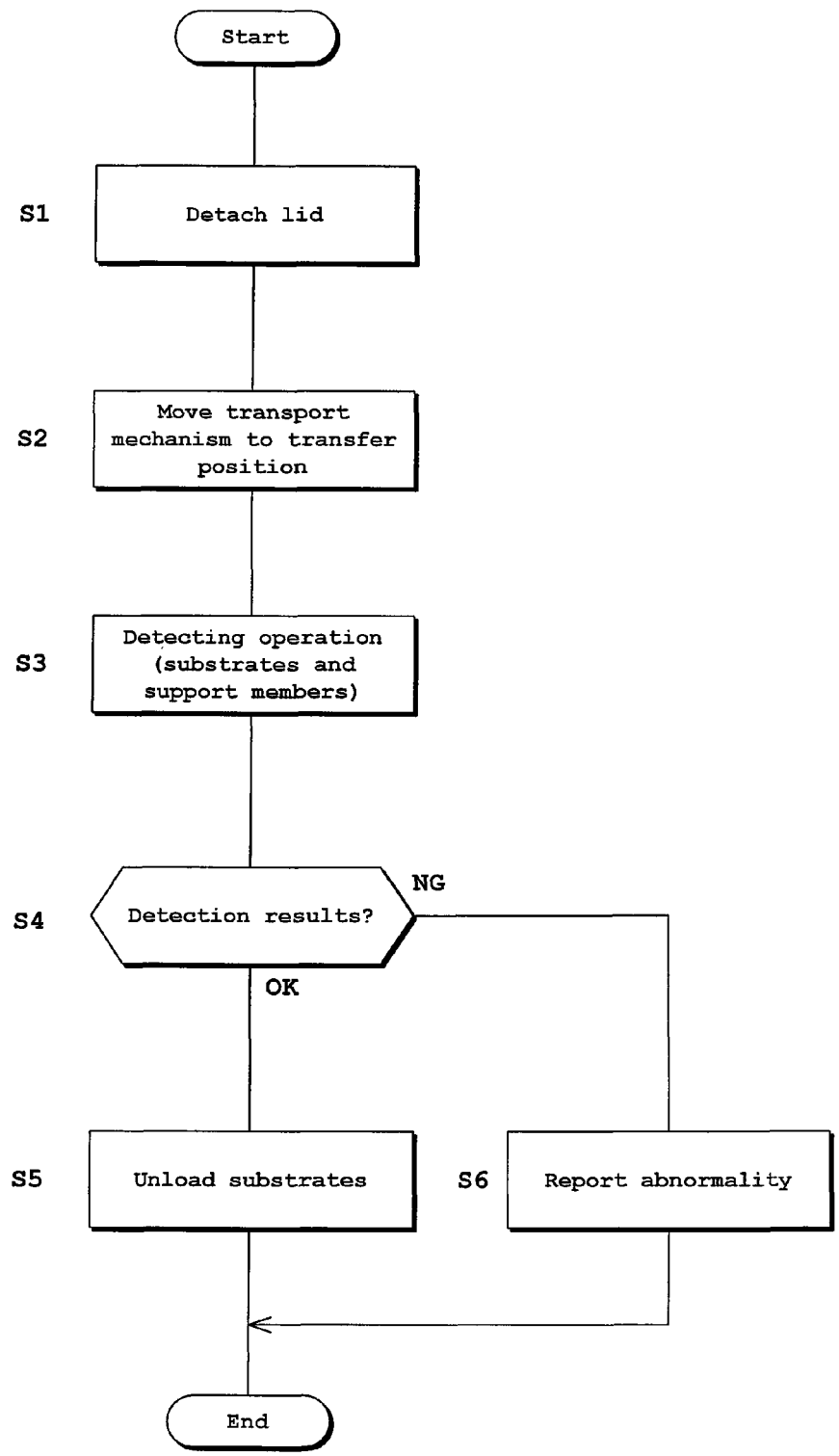
FIG. 4 is a flow chart showing an operation for unloading substrates.
Figure 5:
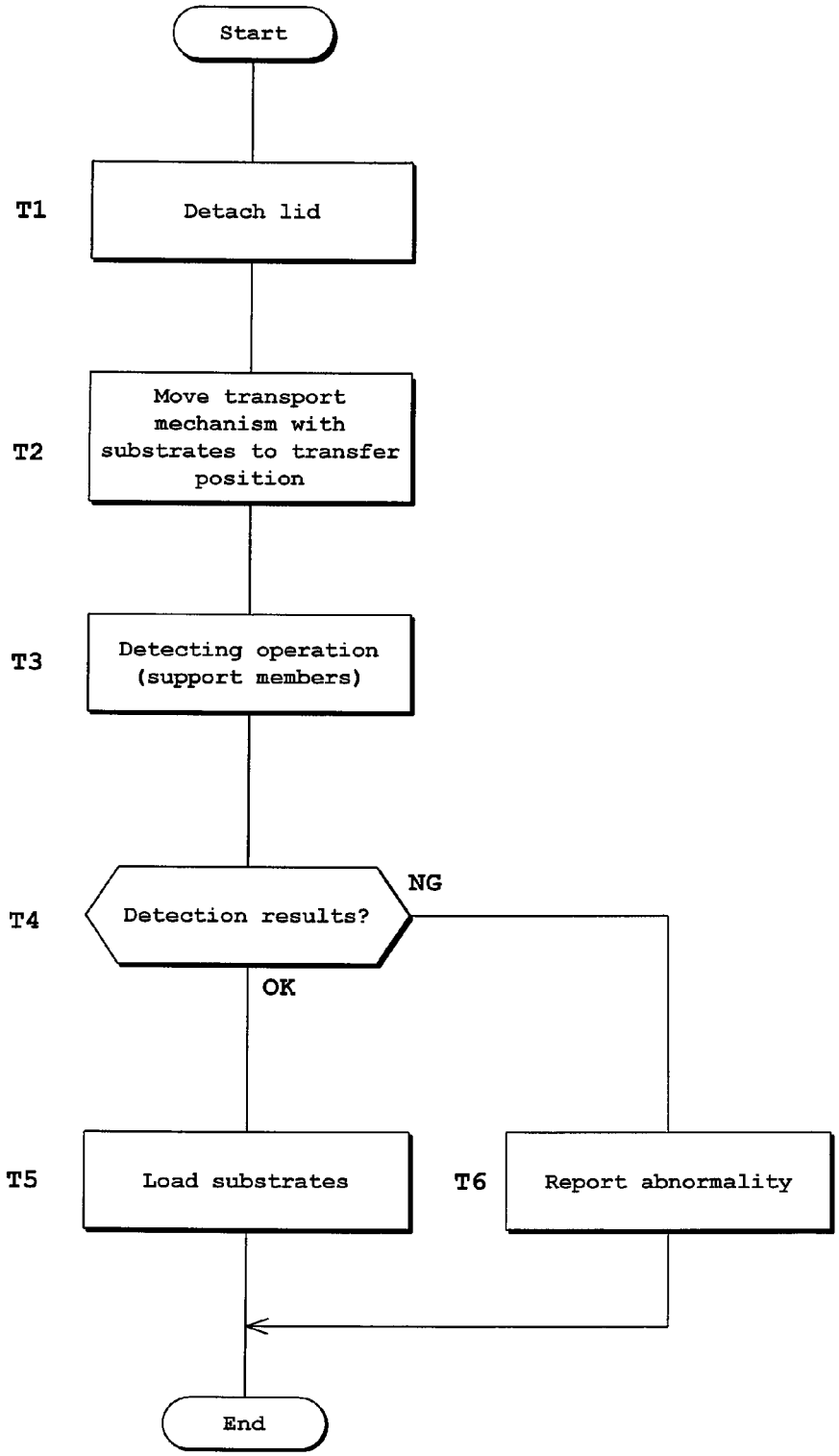
FIG. 5 is a flow chart showing an operation for loading substrates.

Next, operation relating to the table assembly having the above construction will be described with reference to FIGS. 4 and 5. FIG. 4 is a flow chart showing an operation for unloading substrates. FIG. 5 is a flow chart showing an operation for loading substrates.

<Unloading Operation>

An operation to unload wafers W from inside the FOUP 1 sealed with the lid 7 will be described on the assumption that the transport mechanism 10 has no wafers W supported on the support members 43, and the FOUP 1 stores a plurality of wafers W. The lift member 19 is located in an upper position as shown in FIG. 1.

Step S1

The controller 45 operates the lid attaching and detaching unit 15 to open the lid 7 of FOUP 1. The lid attaching and detaching unit 15 unlocks the lid 7 relative to the FOUP 1, draws the lid 7 away from the FOUP 1, and moves downward with the lid 7.

Step S2

The controller 45 moves the transport mechanism 10 to the transfer position. The transport mechanism 10 is put in a standby state with the support members 43 not extended into the FOUP 1. This state, as seen from a side, is what is shown in FIG. 1.

Step S3

The controller 45 operates the lift actuator 20 to lower the lift member 19 from the upper position. At this time, the mapping sensor 23 detects the wafers W stored on the storage racks in the FOUP 1, and the support member detecting sensor 37 detects the support members 43 in the standby state for extension below the storage racks. Each height position detected is memorized by the controller 45.

Step S4

The controller 45 branches the operation according to results of the detection in step S3.

That is, the controller 45 determines the situation to be normal (OK) when the support members 43 are in positions corresponding to the heights of the storage racks storing the wafers W (slightly below the storage racks) (in the positional relationship of non-interference), and determines the situation to be abnormal (NG) when the support members 43 are not in such positions (in the positional relationship of interference).

Step S5

When the situation is found normal in step S4, the controller 45 operates the transport mechanism 10 to extend the support members 43 into the FOUP 1. After causing the support members 43 to pick up and support the wafers W, the controller 45 retracts the support members 43 out of the FOUP 1. As a result, each wafer W is carried out of the FOUP 1 as supported by one of the support members 43.

Step S6

When the situation is found abnormal in step S4, the controller 45 operates the alarm unit 47 to produce an alarm and call the operator's attention. Therefore, no unloading operation takes place.

<Loading Operation>

An operation to load wafers W into the FOUP 1 sealed with the lid 7 will be described on the assumption that the transport mechanism 10 has wafers W supported on the support members 43, and the FOUP 1 stores no wafers W. The lift member 19 is located in the upper position as shown in FIG. 1.

Step T1

The lid attaching and detaching unit 15 is operated to detach the lid 7 as in step S1.

Step T2

The controller 45 moves to the transfer position the transport mechanism 10 having a plurality of wafers W supported on the support members 43, respectively. The transport mechanism 10 is put on standby without extending the support members 43.

Step T3

The controller 45 operates the lift actuator 20 to lower the lift member 19 from the upper position. At this time, the mapping sensor 23 detects no wafers W, and therefore the controller 45 ignores the signals from the mapping sensor 23 and so on. However, the support member detecting sensor 37 detects the support members 43 in the standby state for extension below the storage racks. The height position of each support member 43 is memorized by the controller 45.

Step T4

The controller 45 branches the operation according to results of the detection in step T3.

That is, the controller 45 determines the situation to be normal (OK) when the support members 43 are in the standby position and are in the positional relationship of non-interference with the storage racks in the FOUP 1, and determines the situation to be abnormal (NG) when the support members 43 are not in the standby position.

Steps T5 and T6

When the situation is found normal in step T4, the controller 45 operates the transport mechanism 10 to extend the support members 43 into the FOUP 1 and slightly lower the support members 43 to place the wafers W on the storage racks, respectively. Subsequently, the support members 43 are retracted out of the FOUP 1. As a result, each wafer W is transferred and loaded from one of the support members 43 into the FOUP 1. When the situation is found abnormal in step T4, the controller 45 operates the alarm unit 47 to produce an alarm without operating the transport mechanism 10.

As described above, the controller 45 causes the lid attaching and detaching unit 15 to detach the lid 7, and moves the transport mechanism 10 to the transfer position. Then, based on the results of detection of the wafers W by the mapping sensor 23, and the results of detection of the support members 43 by the support member sensor 37, the controller 45 determines whether the wafers W can be trans-ported or not.

That is, when a plurality of wafers W are stored in the FOUP 1, the controller 45 causes the mapping sensor 23 to carry out a detecting operation, and causes the support member sensor 37 to carry out a detecting operation. Only when it is determined that each support member 43 is in a position suited for transferring one of the wafers W, the controller 45 operates the transport mechanism 10 to unload the wafers W out of the FOUP 1. Therefore, at a time of unloading the wafers W, damage to the wafers W caused by interference between the wafers W and support members 43 is prevented reliably. On the other hand, when the FOUP 1 is empty and a plurality of wafers W are supported by the transport mechanism 10, the controller 45 moves the support member sensor 37 in the direction of alignment of the wafers W to carry out a detecting operation. Only when each support member 43 is determined to be in a height position for transferring one of the wafers W to a storage position of that wafer W in the FOUP 1, the transport mechanism 10 is operated to load the wafers W into the FOUP 1. Therefore, at a time of loading the wafers W, damage to the wafers W caused by interference between the wafers W and support members 43 is prevented reliably.

The wafers W are detected by the light transmitter and receiver 25 and 27 attached to the pair of mapping arms 21. The support members 43 are detected by the light transmitter and receiver 39 and 41 attached to the pair of detecting arms 35. This arrangement can simplify the construction. When the support member sensor 37 fails to detect anything, the alarm unit 47 is operated to notify an abnormality, thereby enabling the operator to become aware of the abnormality.

This invention is not limited to the foregoing embodiment, but may be modified as follows:

(1) In the foregoing embodiment, an optical detection mode is adopted for the protrusion detector 29, mapping sensor 23 and support member sensor 37. Other detecting modes may be employed, such as a sound wave mode. Further, a reflection type detecting mode may be employed adopted of the transmission type detecting mode.

Figure 6:
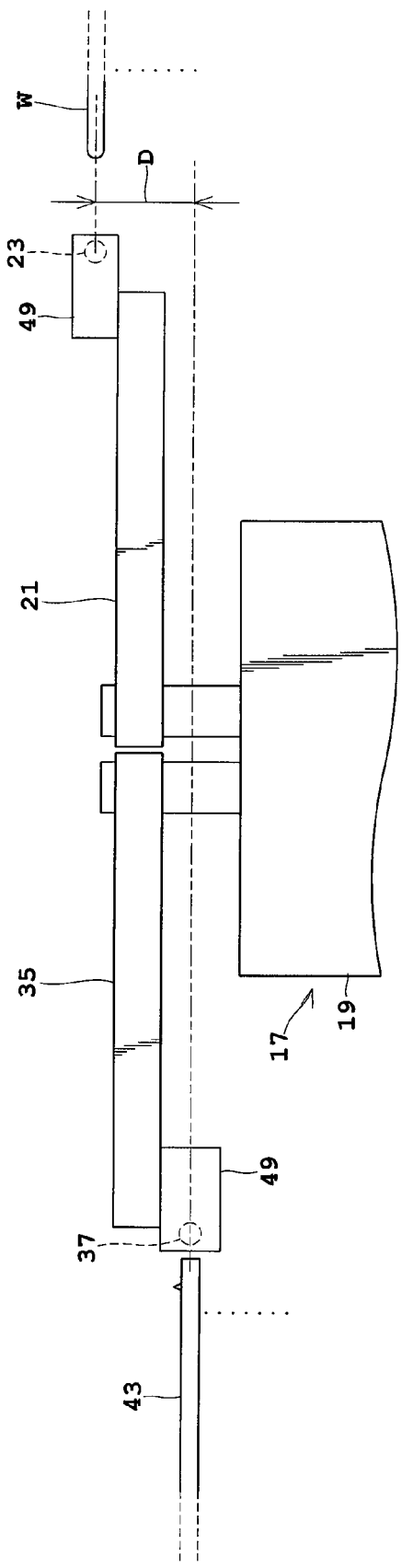
FIG. 6 is a partial enlarged view showing a modified example.

(2) In the foregoing embodiment, the mapping sensor 23 and support member sensor 37 are provided at the same height. This arrangement may be modified as shown in FIG. 6. FIG. 6 is an enlarged view showing a portion of a modified table assembly.

Since the support members 43 are raised from under the wafers W when unloading the wafers W, there exists a difference D in height between each wafer W and each support member 43. The mapping sensor 23 and support member sensor 37 are attached to the mapping arms 21 and detecting arm 35 through sensor mounts 49 so that the mapping sensor 23 and support member sensor 37 are vertically displaced from each other by an amount corresponding to this difference D. This allows the signals relating to the heights of the wafer W and support member 43 can be acquired simultaneously when the detecting unit 17 is at the same height. Consequently, the detecting unit 17 can be moved up and down by the lift actuator 20 at increased speed, thereby expediting the determination as to whether to transfer the wafers W or not.

(3) In the foregoing embodiment, the wafers W, for example, are detected when the detecting unit 17 is lowered. Instead, the detection may be carried out when the detecting unit 17 is raised.

(4) In the foregoing embodiment, the mapping sensor 23 and support member detecting sensor 37 are attached to the arms, respectively. Instead, these sensors may be attached laterally of the lift member 19. This arrangement can dispense with an arm opening and closing mechanism, thereby to simplify the construction.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus that transports a plurality of substrates with a transport device, comprising:
a treating section for treating the substrates;
a table for receiving a FOUP (Front Opening Unified Pod) for storing the plurality of substrates;
an attaching and detaching device disposed between the treating section and the table for attaching and detaching a lid to/from an access opening of the FOUP placed on the table;
the transport device being movable to a transfer position opposed to the access opening of the FOUP across the attaching and detaching device, and having a plurality of support members for supporting the plurality of substrates, the transport device being arranged to transport the substrates as held by the support members between the treating section and the FOUP;
a substrate detecting device for detecting the plurality of substrates stored in the FOUP with the lid detached by the attaching and detaching device;
a support member detecting device for detecting the support members of the transport device; and
a control device for determining whether to transport the substrates, in a state of the lid detached by the attaching and detaching device and the transport device moved to the transfer position, based on a result of detection of the substrates by the substrate detecting device, and a result of detection of the support members by the support member detecting device;
the apparatus further comprising a vertically movable detecting unit disposed between the attaching and detaching device and the transport device, wherein the substrate detecting device is mounted on the detecting unit to be opposed to the FOUP, while the support member detecting device is mounted on the detecting unit to be opposed to the transport device.

2. The apparatus according to claim 1, wherein:
the substrate detecting device is arranged to detect the substrates while moving in a direction of alignment of the substrates stored in the FOUP;
the support member detecting device is arranged to detect the support members while moving in a direction of alignment of the support members; and
the control device is arranged to cause the transport device to unload the substrates out of the FOUP when the support members are determined to be in transfer positions relative to the substrates in the FOUP.

3. The apparatus according to claim 2, wherein:
the support member detecting device is arranged to detect the support members while moving in the direction of alignment of the support members supporting the substrates; and
the control device is arranged to cause the transport device to load the substrates into the FOUP when the support members are determined to be in transfer positions relative to substrate storage positions in the FOUP.

4. The apparatus according to claim 3, wherein the substrate detecting device includes a pair of mapping arms arranged in positions having edges of the substrates in between adjacent the access opening of the FOUP, and a light transmitter and a light receiver attached to distal ends of the mapping arms, respectively, and having an optical axis extending in a direction to detect the edges of the substrates.

5. The apparatus according to claim 3, wherein the support member detecting device includes a pair of detecting arms arranged in positions having the support members in between them adjacent the transport device, and a light transmitter and a light receiver attached to distal ends of the detecting arms, respectively, and having an optical axis extending in a direction to detect the edges of the substrates.

6. The apparatus according to claim 2, wherein the substrate detecting device includes a pair of mapping arms arranged in positions having edges of the substrates in between adjacent the access opening of the FOUP, and a light transmitter and a light receiver attached to distal ends of the mapping arms, respectively, and having an optical axis extending in a direction to detect the edges of the substrates.

7. The apparatus according to claim 2, wherein the support member detecting device includes a pair of detecting arms arranged in positions having the support members in between them adjacent the transport device, and a light transmitter and a light receiver attached to distal ends of the detecting arms, respectively, and having an optical axis extending in a direction to detect the edges of the substrates.

8. The apparatus according to claim 1, wherein the substrate detecting device includes a pair of mapping arms arranged in positions having edges of the substrates in between adjacent the access opening of the FOUP, and a light transmitter and a light receiver attached to distal ends of the mapping arms, respectively, and having an optical axis extending in a direction to detect the edges of the substrates.

9. The apparatus according to claim 8, wherein the support member detecting device includes a pair of detecting arms arranged in positions having edges of the substrates in between adjacent the transport device, and a light transmitter and a light receiver attached to distal ends of the detecting arms, respectively, and having an optical axis extending in a direction to detect the edges of the substrates.

10. The apparatus according to claim 1, wherein the substrate detecting device includes a pair of mapping arms arranged in positions having edges of the substrates in between adjacent the access opening of the FOUP, and a light transmitter and a light receiver attached to distal ends of the mapping arms, respectively, and having an optical axis extending in a direction to detect the edges of the substrates.

11. The apparatus according to claim 1, wherein the support member detecting device includes a pair of detecting arms arranged in positions having the support members in between them adjacent the transport device, and a light transmitter and a light receiver attached to distal ends of the detecting arms, respectively, and having an optical axis extending in a direction to detect the edges of the substrates.

12. A substrate transporting method for transporting substrates to and from a FOUP (Front Opening Unified Pod) for storing a plurality of substrates, the FOUP being placed in a substrate treating apparatus that treats the substrates in a treating section, said method comprising:
a step of detaching a lid from an access opening of the FOUP with an attaching and detaching device, and moving a transport device having a plurality of support members to a transfer position;

a step of carrying out a detecting operation by moving, in a direction of alignment of the substrates, a substrate detecting device mounted on a vertically movable detecting unit disposed between the attaching and detaching device and the transport device to be opposed to the FOUP for detecting the plurality of substrates stored in the FOUP, and a support member detecting device mounted on the vertically movable detecting unit to be opposed to the transport device for detecting the support members of the transport device;

a step of checking, based on the detecting operation, a relative position between the support members of the transport device and the substrates in the FOUP;

a step of notifying an abnormality when the relative position is in a relationship of interference between the substrates and the support members; and a step of carrying out a transporting process when the relative position is in a relationship of non-interference between the substrates and the support members.

* * * * *